(12) United States Patent
Kalb

(10) Patent No.: US 7,049,889 B2
(45) Date of Patent: May 23, 2006

(54) DIFFERENTIAL STAGE VOLTAGE OFFSET TRIM CIRCUITRY

(75) Inventor: Arthur J. Kalb, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 172 days.

(21) Appl. No.: 10/911,371

(22) Filed: Aug. 3, 2004

(65) Prior Publication Data

US 2005/0218980 A1 Oct. 6, 2005

Related U.S. Application Data

(60) Provisional application No. 60/558,401, filed on Mar. 31, 2004.

(51) Int. Cl.
*H03F 3/45* (2006.01)

(52) U.S. Cl. ...................................... 330/253; 330/296
(58) Field of Classification Search ................ 330/253, 330/296, 285, 257, 260, 261, 9, 258
See application file for complete search history.

(56) References Cited

U.S. PATENT DOCUMENTS

| | | | | |
|---|---|---|---|---|
| 4,301,421 A | * | 11/1981 | Yokoyama | ................... 330/253 |
| 6,194,962 B1 | | 2/2001 | Chen | ................... 330/9 |
| 6,215,339 B1 | * | 4/2001 | Hedberg | ..................... 327/108 |
| 6,400,219 B1 | * | 6/2002 | Fayed | ............... 330/9 |
| 6,522,200 B1 | | 2/2003 | Siniscalchi | ................... 330/254 |
| 6,696,894 B1 | | 2/2004 | Huang | .......................... 330/253 |

* cited by examiner

*Primary Examiner*—Henry Choe
(74) *Attorney, Agent, or Firm*—Koppel, Patrick & Heybl

(57) ABSTRACT

Differential stage voltage offset trim circuitry involves the use of one or more trim circuits, each of which is dedicated to trimming one particular source of voltage offset ($V_{os}$) error for a "main" differential pair. One trim circuit may be dedicated to trimming $V_{os}$ error that arises due to mismatch between the main pairs' threshold voltages, and another trim circuit may be dedicated to trimming $V_{os}$ error that arises due to mismatch between the main pairs' beta values. Another trim circuit can trim $V_{os}$ error due to gamma mismatch between the main pair transistors, and respective trim circuits can be employed to trim $V_{os}$ error that arises due to threshold mismatch and/or beta mismatch between the transistors of an active load driven by the main pair. Several trim circuits may be employed simultaneously to reduce offset errors that arise from each of several sources.

20 Claims, 8 Drawing Sheets

DIFFERENTIAL STAGE VOLTAGE OFFSET TRIM CIRCUITRY

This application claims the benefit of provisional patent application No. 60/558,401 to Kalb, filed Mar. 31, 2004.

BACKGROUND OF THE INVENTION

1. Field of the Invention

This invention relates to the field of differential transistor amplifier stages, and particularly to circuits and methods for trimming a differential transistor stage's offset voltage.

2. Description of the Related Art

All transistor amplifiers are prone to voltage offset ($V_{os}$) errors which affect their accuracy. Offset error contributions to a MOSFET amplifier originate via several mechanisms. The most common cause of offset error in a MOSFET input stage arises due to a mismatch between the threshold voltages ($V_T$) of the two transistors making up the differential input pair. Several schemes are known to trim out this error. Often, a trim current will be injected differentially into the drains of the input pair; this approach is shown in FIG. 1a. A differential input pair MN1 and MN2 have their source terminals connected to a common node 10, and their gates connected to receive a differential input voltage V+−V−. A bias current source 12 provides a bias current to common node 10 such that MN1 and MN2 conduct respective output currents in response to a differential input voltage applied to V+ and V−; here, the input stage drives an active load comprising transistors MP1 and MP2. Trim currents sources 14 and 16 inject trim currents $I_{trim+}$ and $I_{trim−}$ into the drains of MN1 and MN2, respectively, and are adjusted to reduce the stage's voltage offset error.

Typically, the trim approach shown in FIG. 1a is accurate at only one bias condition, and degrades with input common-mode changes (especially in rail-to-rail amplifiers). The tracking of the trim with temperature change is adjusted for temperature by the designer or test engineer, but the temperature trim is not tied to any physical process, but rather must be determined empirically.

Another $V_{os}$ trim approach involves inserting degeneration resistors into the input pairs' source circuits; two possible schemes are shown in FIGS. 1b and 1c. In FIG. 1b, the amount of current through the resistors is varied by varying their resistance values, to yield a desired offset change at one operating point. In FIG. 1c, tail current is divided between two current sources, and offset trim is varied via trim currents added or subtracted from the tail currents. Unfortunately, this approach can create an undesirable imbalance between the two sides of the input pair. In addition, both of these schemes reduce input stage gain and common-mode input range.

SUMMARY OF THE INVENTION

Differential stage offset voltage trim circuitry is provided which overcomes the problems noted above, providing accurate offset trimming over a range of common-mode input voltages without the use of degeneration resistors. Offset error caused by the transistors of an active load is also addressed by the invention.

The invention involves the use of one or more trim circuits, each of which is dedicated to trimming one particular source of offset error for a "main" differential pair. For example, to trim offset error due to mismatch between the threshold voltages of the main pair, the invention provides a second differential pair and circuitry arranged to make the second differential pair's common-mode input voltage approximately equal to the main pair's common-mode input voltage. Then, first and second programmable current sources provide respective currents to the second pairs' control inputs, to create a desired differential voltage across the second differential pair. This causes the second pair to conduct respective trim currents, which are coupled to the main pairs' output currents. The current sources are programmed to trim voltage offset error in the main pair that arises due to threshold mismatch. Another trim circuit is dedicated to correcting error due to a mismatch between the main pairs' beta values. Here, a second differential pair, biased like the main pair, is connected to create a current proportional to the tail current of the main pair which tracks with the main pair's common mode voltage. The second pair conducts a reference current in response, which is applied to the reference current input of a digital-to-analog converter (DAC). The DAC produces trim currents at respective current outputs, with the trim currents varying with the reference current and scaled by a digital value applied to the DAC's digital input. The trim currents are coupled to the main pairs' output currents. The DAC is programmed to trim offset error in the main pair that arises due to beta mismatch.

A circuit dedicated to trimming offset error due to gamma mismatch between the main pair transistors comprises a circuit which generates a reference current which varies linearly (or linearly with an additive constant (i.e., ax+b), with the constant subtracted out elsewhere) with the main pair's common-mode input voltage. A DAC receives the reference current, and produces currents I1 and I2 which vary with the reference current and are scaled by a digital value applied to the DAC's digital input. A third differential pair receives I1 and I2 and conducts respective trim currents in response. The trim currents are coupled to the main pair's output currents, and the DAC is programmed to trim voltage offset error that arises in the main pair due to gamma mismatch.

Similar circuits may be provided to trim offset error that arises due to threshold mismatch and/or beta mismatch between the transistors of an active load driven by the main pair. Preferably, several of the trim circuits described herein are employed simultaneously, to reduce offset errors that arise from each of several sources.

Further features and advantages of the invention will be apparent to those skilled in the art from the following detailed descriptions, taken together with the accompanying drawings.

DETAILED DESCRIPTION OF THE INVENTION

The present invention provides several trim circuits, each of which addresses one particular source of offset voltage error for a differential stage. When used in combination, the stage's voltage offset error is substantially reduced.

The circuits described herein are applicable to both bipolar and FET differential stages, whether they are input or non-input stages. The invention is also applicable to the active loads of differential stages. Rail-to-rail amplifiers are also contemplated, as the invention could be used to reduce offset voltage error associated with both the p-type and n-type differential pair. However, for purposes of the present discussion, a single FET differential input stage is used to illustrate the invention's operation.

Figure 1A:
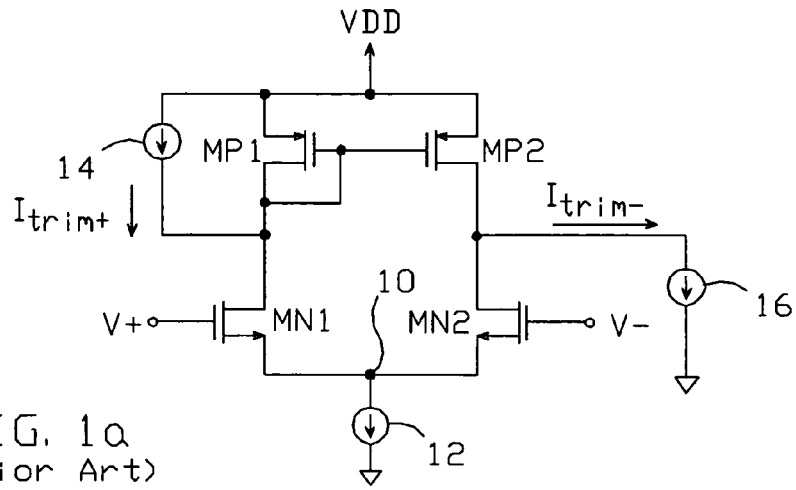
FIGS. 1a–1c illustrate known differential input stage offset voltage trim circuits.
Figure 1B:
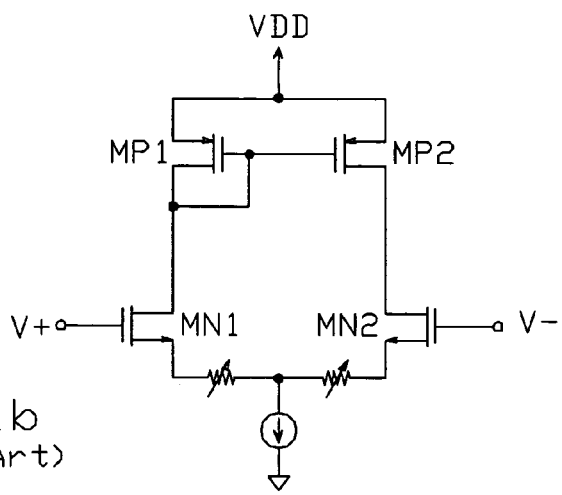
Figure 1C:
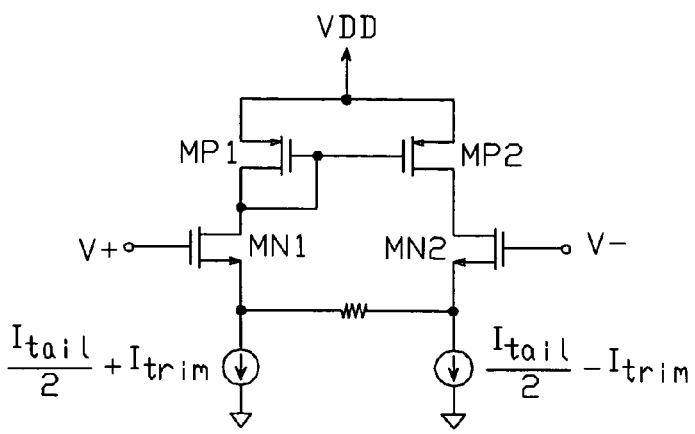
Figure 2:
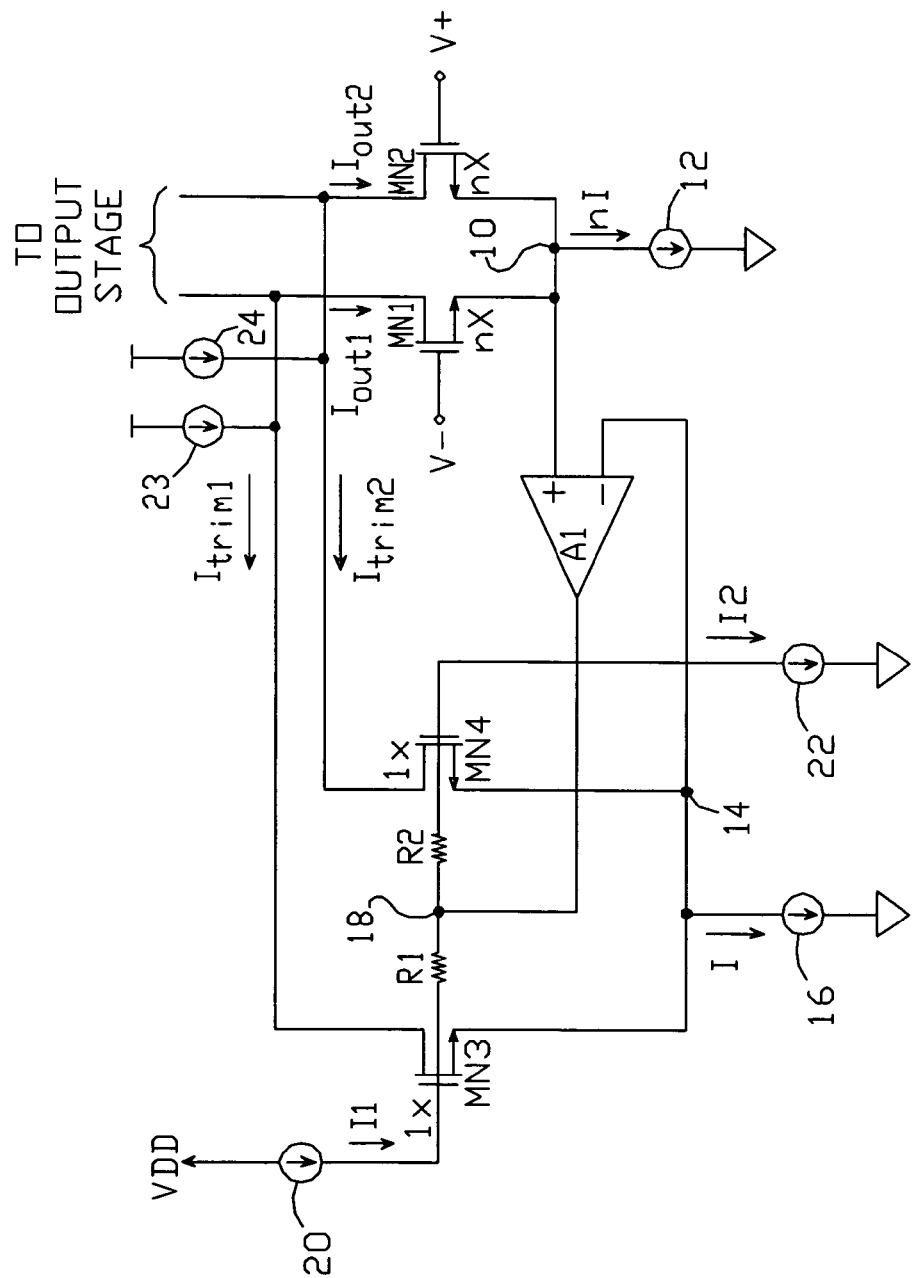
FIG. 2 is a schematic diagram of a circuit for trimming threshold mismatch per the present invention.

The most common source of voltage offset error in a FET differential input stage arises due to a mismatch between the threshold voltages of the transistors making up the "main" differential pair—i.e., the pair whose offset voltage error is to be reduced. The invention reduces this error by setting up a second differential pair having a common-mode input voltage which is approximately equal to the common-mode input voltage of the main pair. One circuit for achieving this is shown in FIG. 2. A main differential pair MN1 and MN2 have their sources connected together at a common node 10, which is connected to a current source 12. The gates of MN1 and MN2 are connected to respective input terminals V− and V+, which receive a differential input voltage. Current source 12 provides a first bias current n*I to the main pair, such that MN1 and MN2 conduct respective output currents $I_{out1}$ and $I_{out2}$ in response to a differential input voltage applied across V− and V+. Output currents $I_{out1}$ and $I_{out2}$ would typically connect to a gain or output stage (not shown).

A second differential pair MN3 and MN4 have their sources connected together at a common node 14, which is connected to a current source 16 that provides a second bias current I to the second pair. A servomechanism, preferably an op amp A1, has its inputs connected to common nodes 10 and 14, and its output connected to a node 18 which is coupled to the gates of MN3 and MN4 via resistors R1 and R2.

Connecting A1 as described servos common node 14 of the second pair to equal that at common node 10 of the main pair. The ratio of the sizes of MN3 and MN4 (1*x) to the sizes of MN1 and MN2 (n*x) is made equal to the ratio of the second bias current (I) to the first bias current (n*I). When so arranged, the second pair is subject to essentially the same bias conditions as the main pair.

A pair of programmable current sources 20 and 22 are connected to provide currents I1 and I2 to the gates of MN3 and MN4, respectively. I1 and I2 are adjusted to produce a desired differential voltage across MN3 and MN4, which results in MN3 and MN4 conducting trim currents $I_{trim1}$ and $I_{trim2}$, respectively. Trim currents $I_{trim1}$ and $I_{trim2}$ are then coupled to the drains of MN1 and MN2, thereby injecting $I_{trim1}$ and $I_{trim2}$ into $I_{out1}$ and $I_{out2}$, respectively. Programmable current sources 20 and 22 are adjusted to reduce voltage offset error in the main pair that arises due to threshold mismatch between MN1 and MN2.

Assuming R1 and R2 each have a resistance R, and currents I1=I2=$I_t$, then the differential trim current $I_{trim1}$−$I_{trim2}$ is given by:

$$I_{trim1} - I_{trim2} = 2 * I_t * R * gm_2,$$

where $gm_2$ is the transconductance of second pair transistors MN3 and MN4. The second pair produces an input-referred offset voltage $V_{off}$ for the main pair given by:

$$V_{off} = (2 * I_t * R * gm_2)/gm_1$$

where $gm_1$ is the transconductance of the main differential pair. In this way, a desired offset voltage reduction is achieved by adjusting programmable current sources 20 and 22 to provide a $V_{off}$ voltage necessary to reduce or eliminate voltage offset error due to threshold mismatch.

As seen above, $V_{off}$ is proportional to $2*I_t*R$. Since threshold mismatch is roughly temperature independent, depending on fixed charges and doping levels, if $I_t*R$ is made constant with temperature, the threshold mismatch component of the offset error can be nulled out to a high degree of accuracy. This trim holds up over temperature and common-mode input voltage. A temperature-independent $I_t*R$ can be made by, for example, producing a bandgap voltage and causing a reference current to flow through a resistor until the voltage across the resistor equals the bandgap voltage. The reference current is then mirrored to produce currents I1 and I2. Note that, alternatively, $I_t*R$ could be made to have a desired temperature characteristic.

Note that the common mode components of output currents $I_{out1}$ and $I_{out2}$ might be provided by injecting currents into the MN1/MN2 drains; these currents could be provided by, for example, current sources 23 and 24 as shown in FIG. 2, or could be provided by the stage driven by $I_{out1}$ and $I_{out2}$. This ensures that only the differential trim current appears at the drains of MN1 and MN2. These current sources could also be implemented with PMOS transistors. Alternatively, these current sources could be lumped into the loads of the main pair.

Figure 3:
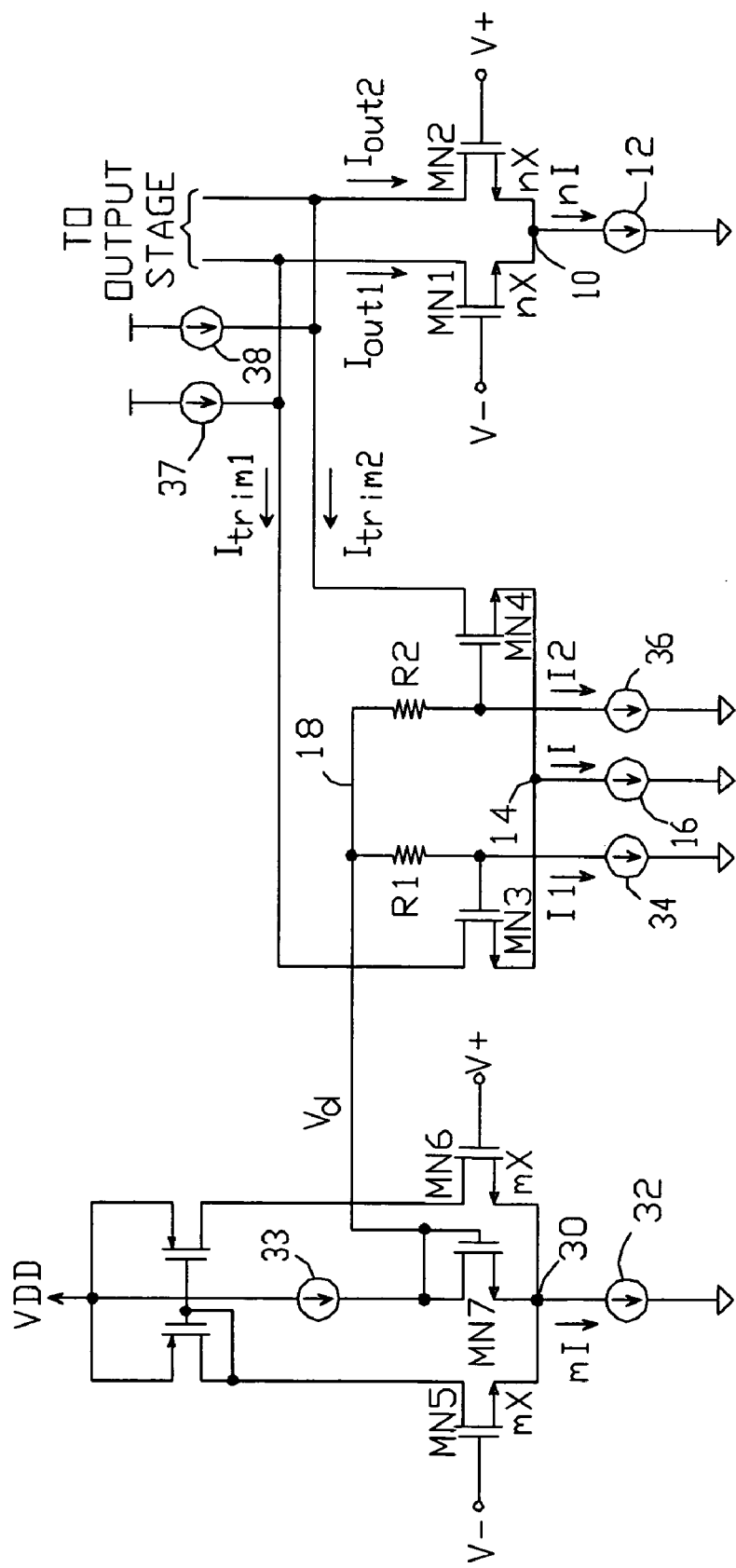
FIG. 3 is a schematic diagram of another circuit for trimming threshold mismatch per the present invention.

An alternative implementation of a trim circuit for reducing threshold mismatch-induced voltage offset error is shown in FIG. 3. Main pair MN1 and MN2 and second differential pair MN3 and MN4 are implemented as described above. To this is added a dummy pair of transistors MN5 and MN6 connected to receive the differential input voltage applied to V− and V+, and having their sources connected to a common node 30. The sizes of MN5 and MN6 (m*x) and the bias current applied to common node 30 (m*I) (by a current source 32) are selected such that the bias conditions for MN5 and MN6 are approximately the same as those for main pair MN1 and MN2, such that the MN5/MN6 source voltage tracks that of MN1/MN2.

A diode circuit, preferably a diode-connected FET MN7, is connected to common node 30 and biased with a current source 33 such that the current density through MN7 is approximately equal to that through MN0–MN6; this results in the generation of a voltage $V_d$ which is one diode voltage drop above common node 30. Voltage $V_d$ is then connected to the common connection 18 of resistors R1 and R2, where it serves to servo the voltage at common node 14 of the second pair to approximately equal that at common node 10 of the main pair (this is ensured by properly setting the current densities of MN7, MN3 and MN4). In this embodiment, the programmable current sources 34 and 36 are connected between the gates of MN3 and MN4, respectively, and a circuit common point. I1 and I2 create a differential voltage across R1 and R2, causing MN3 and MN4 to inject trim currents $I_{trim1}$ and $I_{trim2}$ into output currents $I_{out1}$ and $I_{out2}$, respectively. As before, a desired offset voltage reduction is achieved by adjusting programmable current sources 34 and 36 to provide the trim currents $I_{trim1}$ and $I_{trim2}$ necessary to reduce or eliminate offset error due to threshold mismatch between the main pair transistors. Note that the common mode components of output currents $I_{out1}$ and $I_{out2}$ might be provided by injecting currents into the MN1/MN2 drains; these currents could be provided by, for example, current sources 37 and 38 as shown in FIG. 3, or could be provided by the stage driven by $I_{out1}$ and $I_{out2}$.

Figure 4:
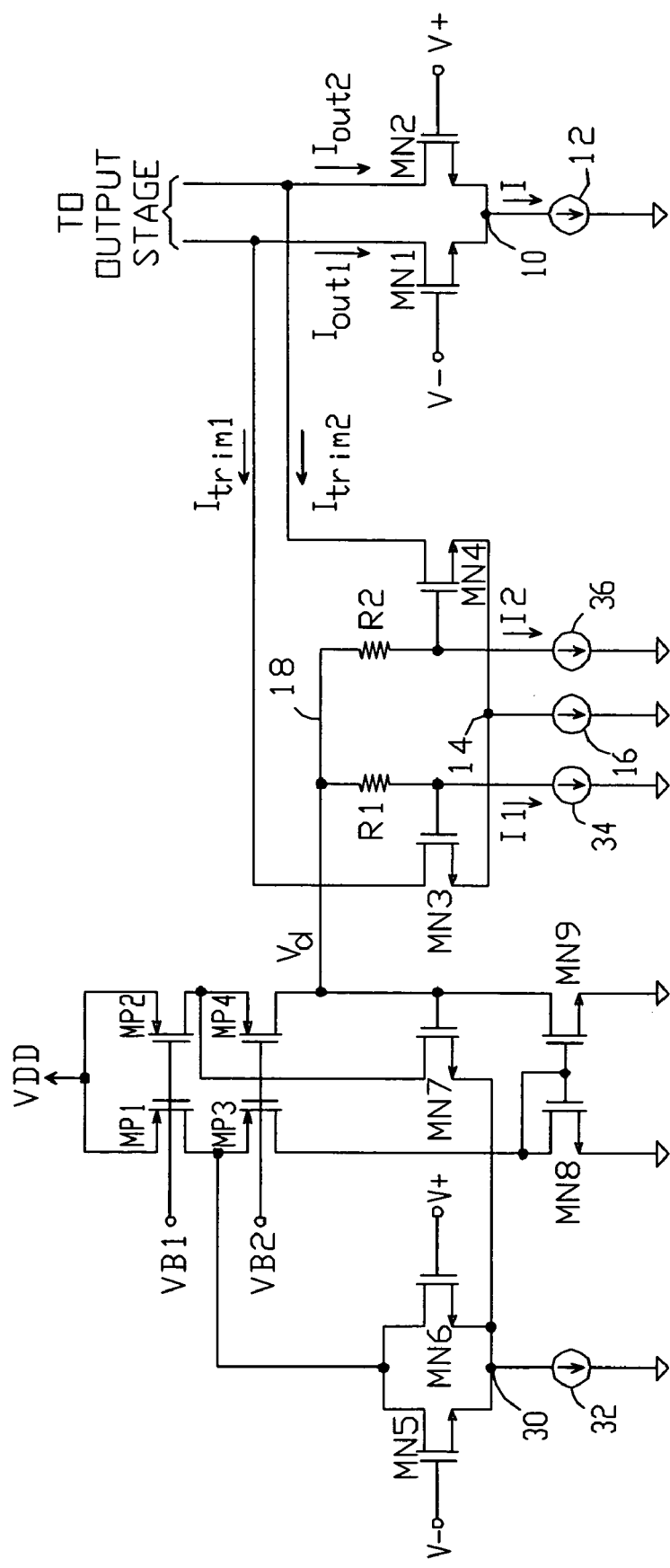
FIG. 4 is a schematic diagram of another circuit for trimming threshold mismatch per the present invention.

Another possible implementation of a trim circuit for reducing threshold mismatch-induced offset error, using a slightly different servo loop, is shown in FIG. 4. Main pair MN1 and MN2, second pair MN3 and MN4, and dummy pair MN5 and MN6 are implemented and biased as described above. Transistors MN5, MN6 and MN7 appear as inputs to an amplifier composed of transistors MN5–MN7, MP1–MP4, MN8 and MN9. The amplifier is in a unity feedback configuration, such that the gate of MN7 is forced to the voltage necessary to maintain a current balance between MN5/MN6 and MN7. This gate voltage ($V_d$) is then used to bias MN3 and MN4, resulting in the MN3/MN4 source voltage being made approximately equal to the MN1/MN2 source voltage. As in FIG. 3, a desired offset voltage reduction is achieved by adjusting programmable current sources 34 and 36 to provide the trim currents $I_{trim1}$ and $I_{trim2}$ necessary to reduce or eliminate offset error due to threshold mismatch between the main pair transistors. This arrangement enables the current density through MN7 to more accurately match that through MN1–MN6, by making its drain-source voltage approximately equal to that of MN1–MN7.

Another source of offset voltage error is due to input stage "beta" mismatch. As used herein, "beta" mismatch is defined as a difference in scaling factor between two transistors. This can be the result of, for example, length or width differences, mobility differences, and/or oxide thickness differences. Small amounts of beta mismatch between the transistors of the main pair manifests itself as a differential drain current proportional to the main pairs' tail current. The invention reduces offset voltage error due to beta mismatch by differentially injecting a trim current proportional to average drain current into the drains of the main pair.

Figure 5A:
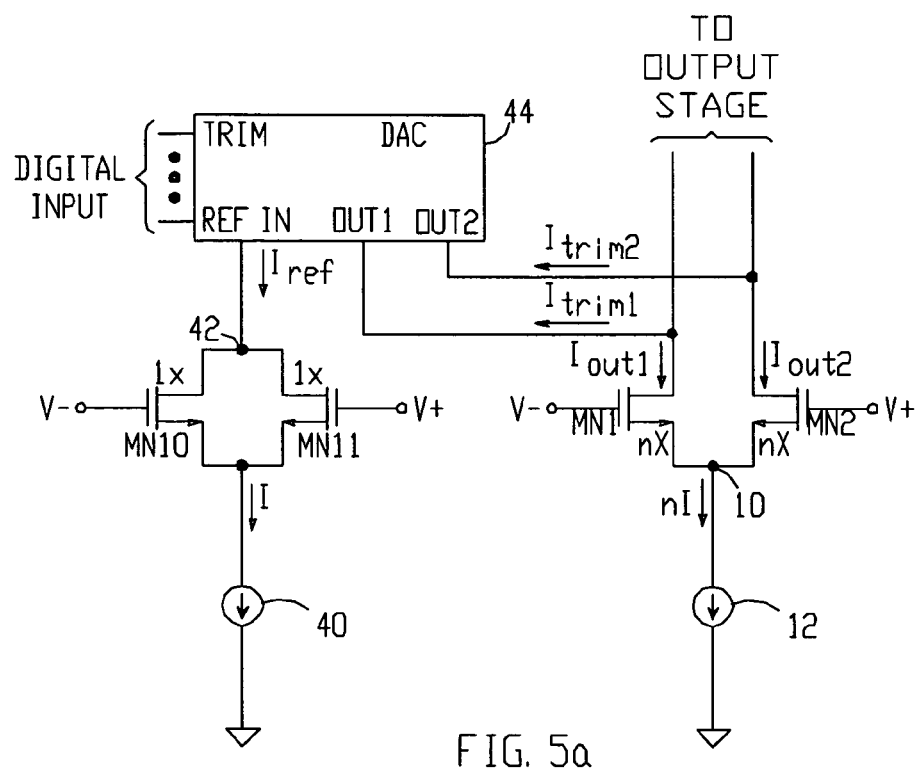
FIGS. 5a and 5b are schematic diagrams of circuits for trimming beta mismatch per the present invention.

One circuit which accomplishes this is shown in FIG. 5a. Main pair MN1 and MN2 are biased with a bias current equal to n*I. A second differential pair MN10/MN11 is connected to receive the differential input voltage and is biased with a bias current I from a current source 40. The ratio of the sizes of MN10 and MN11 (1*x) to the sizes of MN1 and MN2 (n*x) is made equal to ratio of the bias current I to bias current n*I. When so arranged, the second pair is subject to essentially the same bias conditions as the main pair.

The drains of MN10 and MN11 are connected together at a common node 42, such that MN10/MN11 conduct a reference current $I_{ref}$ which varies proportionally with the main pairs' average drain current. Reference current $I_{ref}$ is provided to the reference current input of a digital-to-analog converter (DAC) 44 which is arranged to produce trim currents $I_{trim1}$ and $I_{trim2}$ at respective current outputs, with the trim currents varying with $I_{ref}$ and scaled by a digital value applied to the DAC's digital input. The trim currents are coupled to respective main pair drain currents.

When so arranged, reference current $I_{ref}$, and thus trim currents $I_{trim1}$ and $I_{trim2}$, vary with the main pair's average drain current. Trim DAC 44 scales the current such that trim currents $I_{trim1}$ and $I_{trim2}$ to reduce voltage offset error in the main pair that arises due to mismatch between the beta values of the main pair transistors. Trim currents $I_{trim1}$ and $I_{trim2}$ vary with the common-mode input voltage, resulting in a higher accuracy trim when compared with some other prior art schemes.

Figure 5B:
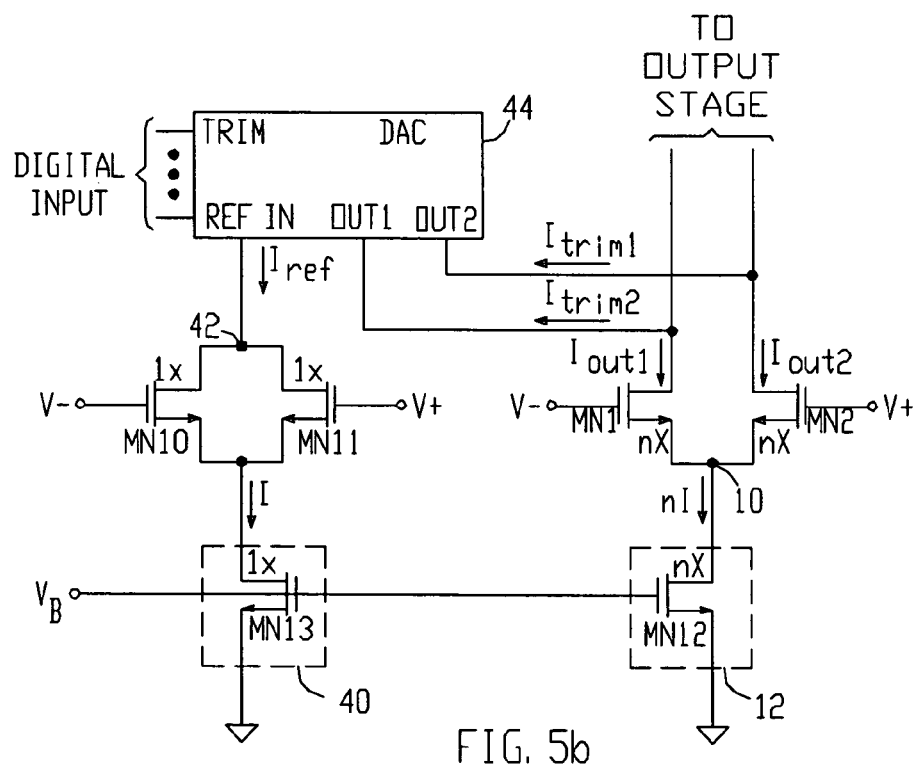

One possible implementation for current sources 12 and 40 is shown in FIG. 5b. Here, bias current source 12 is implemented with a transistor MN12, and bias current source 40 is implemented with a transistor MN13. To achieve the ratios described above, the size of MN13 with respect to MN12 is made to be 1:n. Note that bias current sources 12 and 40 would typically each be implemented with cascoded transistors, rather than with single transistors as shown in FIG. 5b.

Another possible source of offset voltage error arises due to mismatch between the body factors of the main pair transistors—often referred to as "gamma" mismatch. This error is generally linear with common-mode voltage. As with the offset error sources described above, the invention trims gamma mismatch separately from other offset generating mechanisms. This is accomplished by generating a reference current which varies linearly (or linearly with an additive constant (i.e., ax+b), with the constant subtracted out elsewhere) with the source voltage relative to ground (or, for a PMOS pair, source voltage relative to VDD. A current proportional to the reference current is then injected differentially into the drains of the main pair to accomplish the trim.

Figure 6:
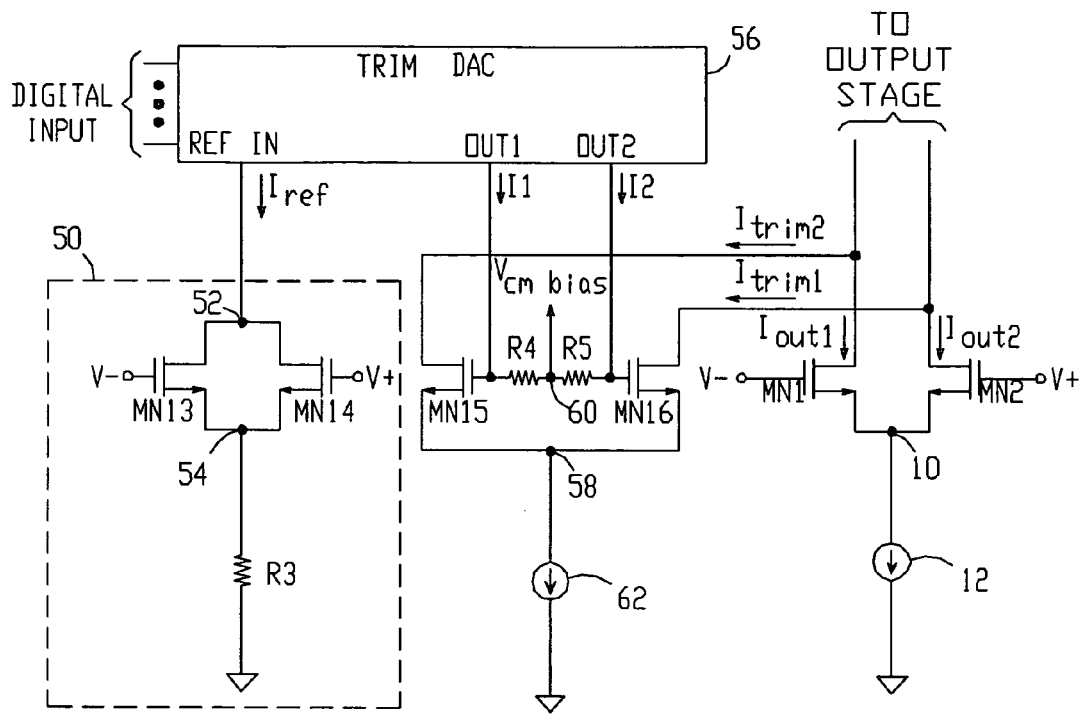
FIG. 6 is a schematic diagram of a circuit for trimming gamma mismatch per the present invention.

One possible implementation of a circuit which accomplishes this is shown in FIG. 6. A gamma trim reference current generator 50 comprises a differential pair MN13 and MN14, having their drains connected together at a node 52 and their sources connected together at a node 54; node 54 is connected to a circuit common point via a resistor R3. MN13 and MN14 receive the differential input voltage, and in response conduct a current $I_{ref}$ which is proportional to the second pair's common-mode input voltage ($V_{cm}$)—which in turn varies with the main pair's common-mode input voltage. A trim DAC 56 receives $I_{ref}$ and produces currents I1 and I2 at respective current outputs, with the currents I1 and I2 varying with the reference current and scaled by a digital value applied to the DAC's digital input.

Currents I1 and I2 are connected to the gates of a differential pair MN15 and MN16, having their sources connected together at a node 58 and their gates connected together at a node 60 via respective resistors R4 and R5; a bias current source 62 provides a bias current to node 58. Node 60 is preferably connected to a bias voltage which varies with common-mode input voltage, such as voltage $V_d$ in FIGS. 3 and 4. Currents I1, I2 and resistors R4, R5 produce a differential voltage across MN15/MN16, such that MN15 and MN16 conduct respective trim currents $I_{trim1}$ and $I_{trim2}$, which are proportional to the differential voltage multiplied by the differential pair's transconductance. Trim currents $I_{trim1}$ and $I_{trim2}$ are injected into the drain nodes of the main pair transistors. The digital input to trim DAC 56 is adjusted to reduce voltage offset error that arises due to mismatch between the body factors of the main pair transistors—i.e., gamma mismatch.

Figure 7:
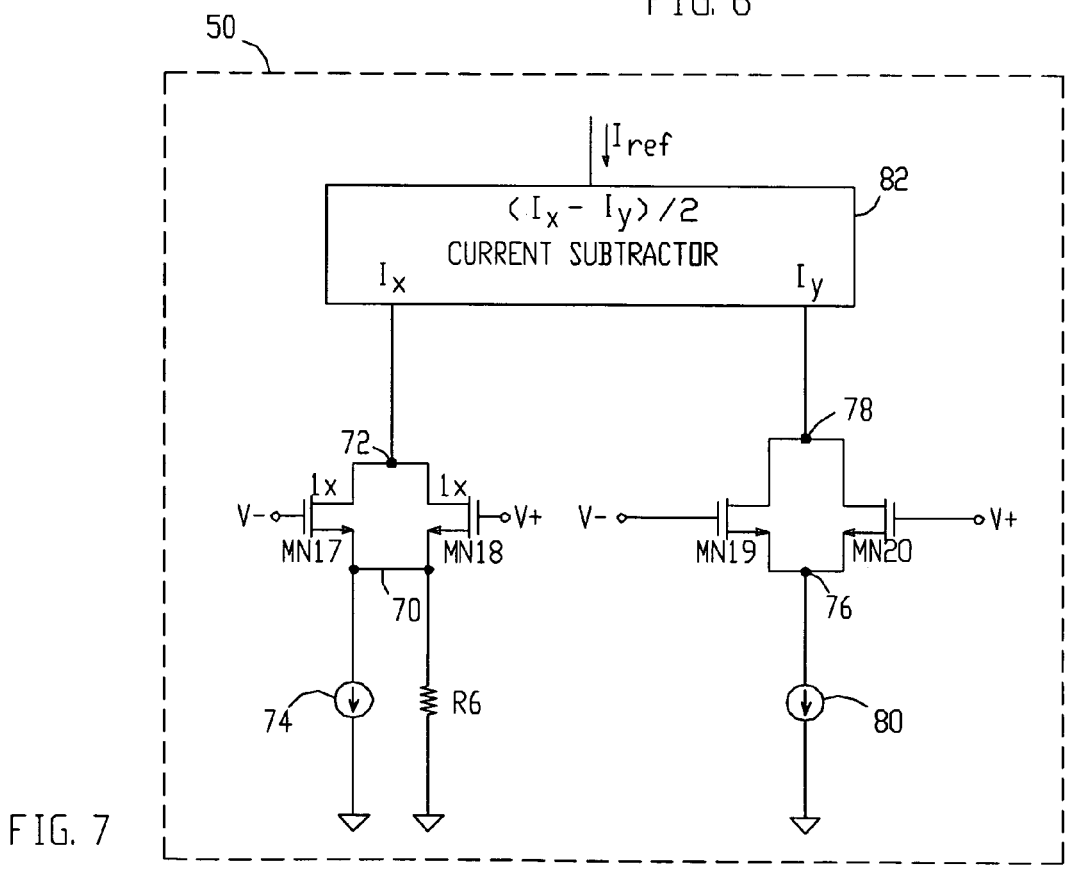
FIG. 7 is a schematic diagram of an alternative embodiment of a circuit for trimming gamma mismatch per the present invention.
Figure 10:
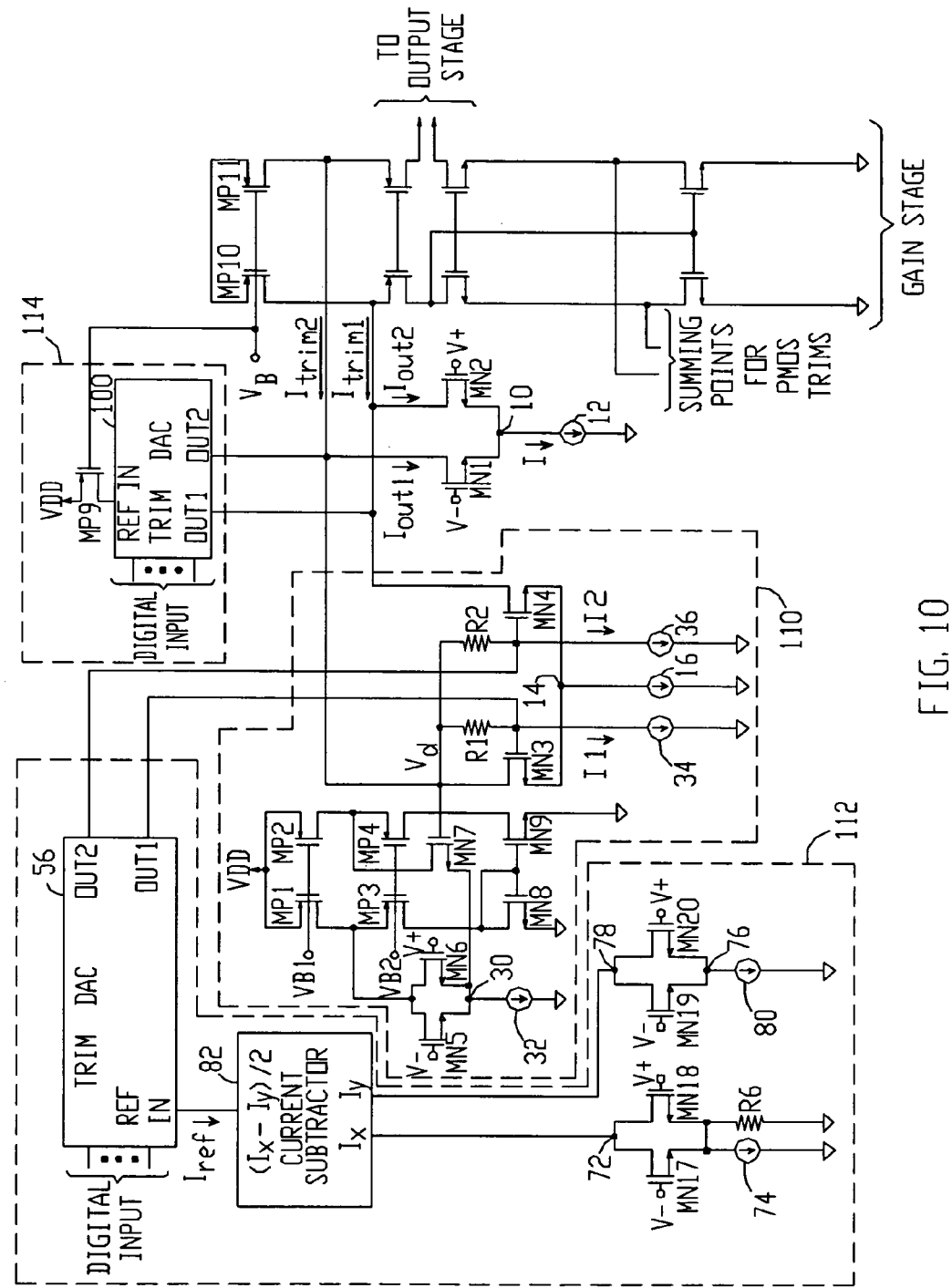
FIG. 10 is a schematic diagram of a circuit for reducing offset errors from several different sources.

In FIG. 6, the currents I1, I2 from trim DAC 56 are provided to MN15/MN16. Note that I1, I2 might alternatively be provided to a differential pair used to trim threshold mismatch, such as MN3/MN4 in FIGS. 3 and 4—thereby eliminating the need for a separate pair such as MN15/MN16 dedicated to gamma mismatch. An arrangement of this sort is shown in FIG. 10. Another possible embodiment of gamma trim reference current generator 50 is shown in FIG. 7. Here, a differential pair MN17/MN18 have their gates connected to receive the differential input voltage, their sources connected together at a node 70, and their drains connected together at a node 72; a bias current source 74 and a resistor R6 are connected between node 70 and a circuit common point. Current source 74 improves the accuracy with which the current density of MN17/MN18 can be matched to MN1/MN2. A differential pair MN19/MN20 have their gates connected to receive the differential input voltage, their sources connected together at a node 76, and their drains connected together at a node 78; a bias current source 80 is connected between node 76 and circuit common. The MN17/MN18 and MN19/MN20 pairs conduct respective currents $I_x$ and $I_y$ to a current subtractor 82, which calculates $(I_x-I_y)/2$ to produce the reference current $I_{ref}$ delivered to trim DAC 56. Generating $I_x$ and $I_y$ is a by-product of getting MN17/MN18 biased up; performing the subtraction serves to eliminate the bias current. The schemes shown in FIGS. 6 and 7 provide simple and effective trim of gamma mismatch. Note that other, more precise, and complicated, gamma mismatch trim schemes—based on fixing the common-mode voltage and varying the bulk-source voltage—might also be employed.

Figure 8:
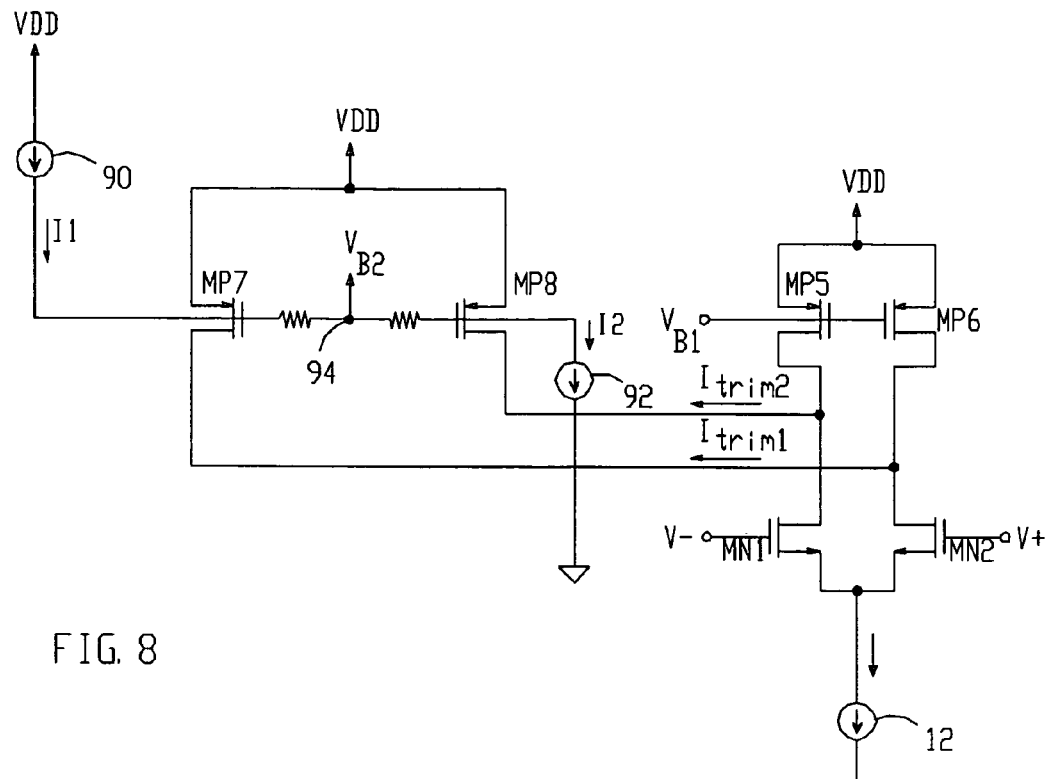
FIG. 8 is a schematic diagram of a circuit for trimming mismatch between the threshold values of a differential stage's active load per the present invention.

When the main differential pair drives an active load, the transistors making up the active load can be another source of offset voltage error. The error can be due to threshold mismatch and/or beta mismatch between the active load's transistors, which may result in unequal drain currents that, when reflected to the amplifier's inputs, cause offset error. One possible circuit for correcting threshold mismatch between the active load's transistors is shown in FIG. 8. Here, main pair MN1/MN2 drive an active load made from transistors MP5 and MP6, each of which is biased with a bias voltage $V_{B1}$. A pair of PMOS FETs MP7 and MP8 is biased like active load transistors MP5 and MP6, with their sources connected to supply voltage VDD and their gates connected to a bias voltage $V_{B2}$, preferably though not necessarily the same as $V_{B1}$, via respective resistors. The gates of MP7 and MP8 are also connected to respective programmable current sources 90 and 92, which provide currents I1 and I2, respectively, that create a desired differential voltage across MP7 and MP8. In response to I1 and I2, MP7 and MP8 conduct respective trim currents $I_{trim1}$ and $I_{trim2}$—which are injected into the main pair drains. Programmable current sources 90 and 92 are adjusted as necessary to match the drain currents of MP5 and MP6, and thereby reduce voltage offset error that might otherwise arise due to threshold mismatch between the main pair's active load transistors.

Figure 9:
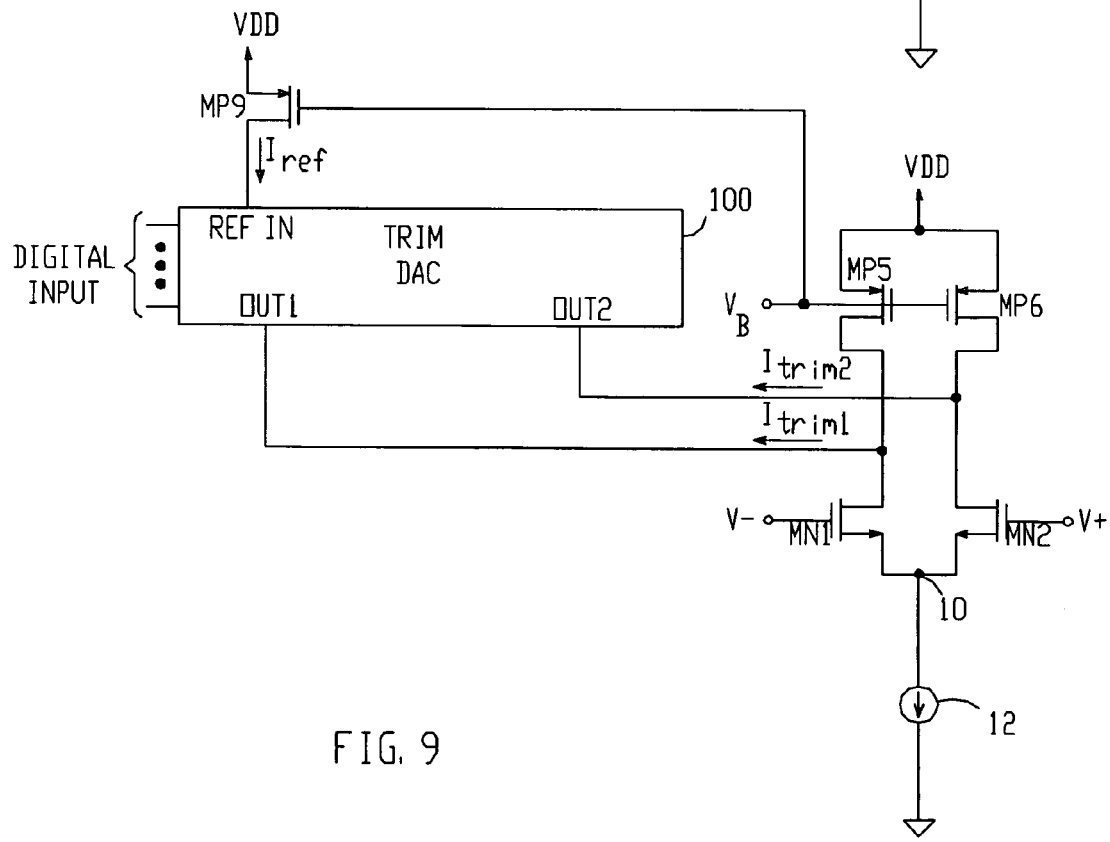
FIG. 9 is a schematic diagram of a circuit for trimming mismatch between the beta values of a differential stage's active load per the present invention.

One possible circuit for trimming beta mismatch between the active load's transistors is shown in FIG. 9. A PMOS FET MP9 is biased like the active load transistors, and conducts a reference current $I_{ref}$. A trim DAC 100 receives $I_{ref}$ at its reference current input and produces trim currents $I_{trim1}$ and $I_{trim2}$ at respective current outputs, with the trim currents varying with the reference current and scaled by a digital value applied to the DAC's digital input. The trim currents are coupled to respective main pair output currents, and DAC 100 is adjusted as necessary to match the drain currents of MP5 and MP6, and thereby reduce voltage offset error that might otherwise arise due to beta mismatch between the main pair's active load transistors.

Several of the trim circuits described herein may be simultaneously employed to reduce the voltage offset error of a differential pair, with each trim circuit trimming $V_{os}$ error that arises from one particular source. This is illustrated in FIG. 10. Here, main pair MN1/MN2 conduct output currents $I_{out1}$ and $I_{out1}$ as before, which would typically be connected to a gain stage (as shown in FIG. 10) or an output stage. Voltage offset error due to threshold mismatch between MN1 and MN2 is reduced with circuitry 110 which is similar to that shown in FIG. 4. Programmable current sources 34 and 36 are adjusted as necessary to reduce voltage offset error which is caused by threshold mismatch between MN1 and MN2.

Gamma mismatch is addressed by circuit 112, which is similar to that shown in FIGS. 6 and 7. Here, the digital input to trim DAC 56 is adjusted as necessary to reduce voltage offset error which is caused by gamma mismatch between MN1 and MN2.

Beta mismatch between the transistors of an active load being driven by MN1 and MN2 (transistors MP10 and MP11 in FIG. 10) is trimmed with circuit 114, which is similar to that shown in FIG. 9. Here, the digital input to trim DAC 100 is adjusted as necessary to reduce voltage offset error which is caused by beta mismatch between MP10 and MP11.

Circuits for trimming beta mismatch between MN1 and MN2 (such as those shown in FIGS. 5a and 5b) and threshold mismatch between MP10 and MP11 (such as that shown in FIG. 8) could also be employed if necessary. In fact, the trim circuits described herein could be used in any combination. The number and type of circuits used would depend on the specific application, with the differential stage's offset voltage specification and the acceptable level of circuit complexity being primary factors.

Note that the trim circuit implementations discussed above are merely exemplary; each of the circuits described could be implemented in a variety of different ways. It is only essential that each trim circuit be employed to reduce offset voltage error that arises due to one particular source.

While particular embodiments of the invention have been shown and described, numerous variations and alternate embodiments will occur to those skilled in the art. Accordingly, it is intended that the invention be limited only in terms of the appended claims.

I claim:

1. A differential stage, comprising:
   a main differential transistor pair which is biased to conduct respective output currents in response to a differential input voltage;
   a second differential transistor pair;
   circuitry connected to said second differential transistor pair and arranged to make said second pair's common-mode input voltage approximately equal to said main pair's common-mode input voltage; and
   first and second programmable current sources arranged to create a desired differential voltage across said second differential transistor pair such that the transistors of said second pair conduct respective trim currents, said trim currents coupled to respective ones of said output currents, said first and second programmable current sources programmed such that said trim currents reduce voltage offset error in said main differential pair which arises due to the transistors of said main pair having mismatched threshold voltages.

2. A differential stage, comprising:
   a main differential pair comprising first and second transistors, each of which has a control input and first and second current terminals, said second current terminals connected together at a first node;

a first bias current source connected to said first node which provides a first bias current to said main differential pair such that said first and second transistors conduct respective output currents at their first current terminals in response to a differential input voltage applied across their control inputs, said first differential pair having an associated common-mode input voltage;

a second differential pair comprising third and fourth transistors, each of which has a control input and first and second current terminals, said second current terminals connected together at a second node;

a second bias current source connected to provide a second bias current to said second differential pair;

circuitry connected to said second differential pair and arranged to make said second differential pair's common-mode input voltage approximately equal to said main pair's common-mode input voltage; and first and second trim current sources arranged to provide respective currents I1 and I2 to the control inputs of said third and fourth transistors, respectively, to create a desired differential voltage across said second differential pair such that said third and fourth transistors conduct respective trim currents $I_{trim1}$ and $I_{trim2}$, said trim currents coupled to respective ones of said output currents.

3. The input stage of claim 2, wherein the ratio between the first and second bias currents is approximately equal to the ratio between the sizes of said first and second transistors with respect to the sizes of said third and fourth transistors, respectively.

4. The input stage of claim 2, wherein said circuitry comprises:

first and second resistors connected in series between the control inputs of said third and fourth transistors, the junction of said first and second resistors being a third node; and a servomechanism having its inputs connected to said first and second nodes and its output connected to said third node such that the voltage at said second node is servoed to be approximately equal to the voltage at said first node.

5. The input stage of claim 4, wherein said first and second resistors each have a resistance R, and said currents $I1=I2=I_t$, such that the differential trim current $I_{trim1}-I_{trim2}$ is approximately given by:

$$I_{trim1}-I_{trim2}=2*I_t*R*gm_2,$$

where $gm_2$ is the transconductance of the second differential pair, and said second differential pair produces an input-referred offset voltage $V_{off}$ for said main pair given by:

$$V_{off}=2*I_t*R*gm_2/gm_1$$

where $gm_1$ is the transconductance of the main differential pair.

6. The input stage of claim 5, wherein said resistors and said trim current sources are arranged such that $I_t*R$ is approximately constant over temperature.

7. The input stage of claim 5, wherein said resistors and said trim current sources are arranged such that $I_t*R$ has a desired temperature characteristic.

8. The input stage of claim 6, wherein said trim current sources comprise:

at least one bandgap voltage source which produces a bandgap voltage; and respective resistors, said bandgap voltage connected across respective ones of said resistors to produce said currents I1 and I2.

9. The input stage of claim 2, wherein said main and second differential pairs are MOSFETs.

10. The input stage of claim 9, wherein said first and second trim current sources are programmable current sources, said first and second trim current sources programmed to produce trim currents I1 and I2 to substantially reduce voltage offset error in said main differential pair which arises due to said first and second transistors having mismatched threshold voltages.

11. The input stage of claim 2, wherein said main and second differential pairs are bipolar transistors.

12. The input stage of claim 2, wherein said circuitry comprises:

a dummy differential pair comprising fifth and sixth transistors, each of which has a control input and first and second current terminals, said control inputs connected to receive said differential input voltage and said second current terminals connected together at a third node;

a third bias current source connected to said third node which provides a third bias current to said third differential pair such that said fifth and sixth transistors conduct respective currents at their first current terminals in response to said differential input voltage; and a diode circuit connected at one terminal to said third node and at its other terminal to the control inputs of said second differential pair via respective resistors, such that the voltage at said second node is servoed to be approximately equal to the voltage at said first node.

13. The input stage of claim 12, wherein the ratio between the first and third bias currents is approximately equal to the ratio between the sizes of said first and second transistors with respect to the sizes of said fifth and sixth transistors.

14. The input stage of claim 13, wherein said diode circuit comprises:

a diode-connected transistor; and a current source connected to provide a bias current to said diode-connected transistor such that the current density through said diode-connected transistor is approximately equal to the current densities through said main pair, said second pair, and said dummy pair.

15. The input stage of claim 2, wherein said first trim current source is connected between the control input of said third transistor and a circuit common point and said second trim current source is connected between the control input of said fourth transistor and said circuit common point.

16. The input stage of claim 2, further comprising third and fourth current sources connected to the first terminals of said first and second transistors, respectively, and arranged to provide the common mode components of said output currents.

17. The input stage of claim 2, wherein said circuitry comprises:

a dummy differential pair comprising fifth and sixth transistors, each of which has a control input and first and second current terminals, said control inputs connected to receive said differential input voltage, said second current terminals connected together at a third node, and said first current terminals connected together at a fourth node;

a third bias current source connected to said third node which provides a third bias current to said third differential pair such that said fifth and sixth transistors conduct respective currents at their first current terminals in response to said differential input voltage;

seventh and eighth transistors, each of which has a control input and first and second current terminals, said first and second current terminals connected between a supply voltage and fifth and sixth nodes, respectively;

ninth and tenth transistors, each of which has a control input and first and second current terminals, said first and second current terminals connected between said fifth and sixth nodes and seventh and eighth nodes, respectively;

an eleventh transistor having a control input and first and second current terminals, said eleventh transistor diode-connected between said seventh node and a circuit common point;

a twelfth transistor having a control input and first and second current terminals, said first and second current terminals connected between said eighth node and said circuit common point;

the control inputs of said seventh and eighth transistors connected to a first bias voltage;

the control inputs of said ninth and tenth transistors connected to a second bias voltage;

the control inputs of said eleventh and twelfth transistors connected together; and a thirteenth transistor having a control input and first and second current terminals, said first and second current terminals connected between said sixth node and said third node and said control input connected to said eighth node;

said eighth node connected to the control inputs of said second differential pair via respective resistors, such that the voltage at said second node is servoed to be approximately equal to the voltage at said first node.

18. A differential input stage, comprising:

a main differential pair comprising first and second transistors and biased with a first bias current such that said main pair conducts respective output currents in response to a differential input voltage;

at least one voltage offset trim circuit, said at least one voltage offset trim circuit comprising:

a trim circuit adjusted to reduce voltage offset error in said main differential pair that arises due to mismatch between the threshold voltages of said first and second transistors, comprising in addition to said main differential pair:

a second differential transistor pair;

circuitry connected to said second differential transistor pair and arranged to make said second pair's common-mode input voltage approximately equal to said main pair's common-mode input voltage; and first and second programmable current sources connected to create a desired differential voltage across said second differential transistor pair such that the transistors of said second pair conduct respective trim currents, said trim currents coupled to respective ones of said output currents, said first and second programmable current sources programmed such that said trim currents substantially reduce voltage offset error in said main differential pair which arises due to the transistors of said main pair having mismatched threshold voltages; and/or a trim circuit adjusted to reduce voltage offset error in said main differential pair that arises due to beta mismatch between said first and second transistors, comprising in addition to said main differential pair:

a second differential transistor pair biased with a second bias current such that said second pair conducts respective output currents in response to said differential input voltage, wherein the ratio between said second and first bias currents is approximately 1:N and the ratio between the sizes of said main pair transistors with respect to the sizes of said second pair transistors, respectively, is approximately 1:N, such that said second pairs' output currents are proportional to said main pairs' average drain current; and a digital-to-analog converter (DAC) connected to receive said second pairs' output currents at a reference current input and arranged to produce trim currents at respective current outputs, said trim currents varying with said second pairs' output currents and thus said main pairs' average drain current and scaled by a digital value applied to said DAC's digital input, said trim currents coupled to respective ones of said main pair's output currents, said DAC programmed to reduce voltage offset error in said main differential pair that arises due to beta mismatch between the transistors of said main pair; and/or a trim circuit adjusted to reduce voltage offset error in said main differential pair that arises due to gamma mismatch between said first and second transistors, comprising in addition to said main differential pair:

circuitry which receives said differential input voltage and is arranged to produce a reference current which varies linearly or linearly with an additive constant with the stage's source voltage relative to ground;

a digital-to-analog converter (DAC) connected to receive said reference current at a reference current input and arranged to produce currents I1 and I2 at respective current outputs, said currents varying with said reference current and scaled by a digital value applied to said DAC's digital input; and a second differential transistor pair which receives currents I1 and I2 and is biased to conduct respective trim currents in response, said trim currents coupled to respective ones of said main pair's output currents, said DAC programmed to reduce voltage offset error in said main pair that arises due to gamma mismatch between the transistors of said main pair; and/or a trim circuit adjusted to reduce voltage offset error in said main differential pair that arises due to threshold mismatch between the transistors of an active load driven by said main differential pair, comprising in addition to said main differential pair:

an active load comprising third and fourth transistors connected in series between a supply voltage and said first and second transistors, respectively, said active load transistors biased with a bias voltage such that they conduct said output currents;

a second differential pair comprising fifth and sixth transistors and biased with said bias voltage; and first and second programmable current sources arranged to provide respective currents I1 and I2 to said fifth and sixth transistors, respectively, to create a desired differential voltage across said second differential pair such that said fifth and sixth transistors conduct respective trim currents, said trim currents coupled to respective ones of said output currents, said first and second trim current sources programmed to produce trim currents I1 and I2 to match the currents conducted by said third and fourth transistors and to thereby reduce voltage offset error in said main differential pair which arises due to said active load transistors having mismatched threshold voltages; and/or a trim circuit adjusted to reduce voltage offset error in said main differential pair that arises due to beta mismatch between the transistors of an active load driven by said main differential pair, comprising in addition to said main differential pair:
- an active load comprising third and fourth transistors connected in series between a supply voltage and said first and second transistors, respectively, said active load transistors biased with a bias voltage such that they conduct said output currents;
- a fifth transistor connected to said supply voltage and said bias voltage such that said fifth transistor is biased like said active load transistors and conducts a reference current which varies with said bias voltage; and
- a digital-to-analog converter (DAC) connected to receive said reference current at a reference current input and arranged to produce first and second trim currents at respective current outputs, said currents varying with said reference current and scaled by a digital value applied to said DAC's digital input;
- said trim currents coupled to respective ones of said main pair's output currents, said DAC programmed to match the currents conducted by said third and fourth transistors and to thereby reduce voltage offset error in said main differential pair that arises due to beta mismatch between said third and fourth transistors.

19. The differential input stage of claim 18, wherein the second differential pair of said trim circuit adjusted to reduce voltage offset error in said main differential pair that arises due to gamma mismatch and the second differential pair of the trim circuit adjusted to reduce voltage offset error in said main differential pair that arises due to mismatch between the threshold voltages of said first and second transistors are the same pair.

20. A method of reducing voltage offset error that arises due to a mismatch between the threshold voltages of a main FET differential pair biased to conduct respective output currents in response to a differential input voltage, comprising:
- providing a second FET differential pair;
- making said second pair's common-mode input voltage approximately equal to said main pair's common-mode input voltage;
- providing first and second programmable currents to said second pair to create a desired differential voltage across said second pair such that the FETs of said second pair conduct respective trim currents;
- coupling said trim currents to respective ones of said output currents; and
- adjusting said first and second programmable currents such that said trim currents reduce voltage offset error in said main differential pair which arises due to the transistors of said main pair having mismatched threshold voltages.

* * * * *